(12) United States Patent
Sun

(10) Patent No.: US 11,626,726 B2
(45) Date of Patent: Apr. 11, 2023

(54) POWER CLAMP CIRCUIT, CHIP AND DUAL-CLAMP METHOD

(71) Applicant: MONTAGE TECHNOLOGY CO., LTD., Shanghai (CN)

(72) Inventor: Chunlai Sun, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 17/458,608

(22) Filed: Aug. 27, 2021

(65) Prior Publication Data
US 2022/0344930 A1  Oct. 27, 2022

(30) Foreign Application Priority Data
Apr. 23, 2021 (CN) .......................... 202110443788.3

(51) Int. Cl.
*H02H 9/04* (2006.01)
*H01L 27/02* (2006.01)

(52) U.S. Cl.
CPC ......... *H02H 9/046* (2013.01); *H01L 27/0285* (2013.01)

(58) Field of Classification Search
CPC ............................ H02H 9/046; H01L 27/0285
USPC ........................................................... 361/56
See application file for complete search history.

(56) References Cited

U.S. PATENT DOCUMENTS

| | | | | |
|---|---|---|---|---|
| 8,766,675 B1* | 7/2014 | Dreps | .................... | H02H 9/041 327/309 |
| 2006/0049893 A1* | 3/2006 | Ozasa | ...................... | H03H 7/25 333/124 |
| 2007/0103190 A1* | 5/2007 | Kubo | .................... | H04L 25/028 326/30 |
| 2014/0355157 A1* | 12/2014 | Huang | ................... | H02H 9/041 361/56 |
| 2017/0125085 A1* | 5/2017 | Kim | .................... | G11C 11/4078 |

* cited by examiner

*Primary Examiner* — Dharti H Patel

(57) ABSTRACT

The present disclosure provides a power clamp circuit, a chip, and a dual-clamp method. The power clamp circuit is applied to a circuit system to monitor the power supply voltage of the circuit system and includes: an EOS protection module, for outputting an EOS protection triggering signal when it is determined that the circuit system is electrically overstressed based on the power supply voltage; an ESD protection module, for outputting an ESD protection triggering signal when it is determined that an electrostatic event is present in the circuit system based on the power supply voltage; a switch control module, for turning on a discharge path based on the EOS protection signal to discharge an EOS current, and turning on the discharge path based on the ESD protection signal to discharge an electrostatic current.

12 Claims, 2 Drawing Sheets

POWER CLAMP CIRCUIT, CHIP AND DUAL-CLAMP METHOD

CROSS REFERENCE TO RELATED APPLICATION

The present application claims the benefit of priority to Chinese Patent Application No. CN 2021104437883, entitled "POWER CLAMP CIRCUIT, CHIP AND DUAL-CLAMP METHOD", filed with CNIPA on Apr. 23, 2021, the disclosure of which is incorporated herein by reference in its entirety for all purposes.

FIELD OF TECHNOLOGY

The present disclosure relates to the technical field of integrated circuit design, in particular to a power clamp circuit, a chip and a dual-clamp method.

BACKGROUND

Electrical Static Discharge (ESD) and Electrical Overstress (EOS) are two important concerns for the reliability of an integrated circuit, but their mechanisms and characteristics are quite different. ESD can have a voltage as high as a few hundred to several thousand volts depending on different specific test methods and models, and its peak current is large, which can be 1 to 10 amps, but the peak current only lasts for several nanoseconds to several microseconds. Additionally, current of ESD can rise up quickly, which usually occurs within 1 to 100 nanoseconds. Therefore, ESD is a transient event and the energy released is small. In comparison, a voltage of EOS is usually relatively low, only higher than the absolute maximum rating of the integrated circuit, and its current can be as large as several amps, duration and voltage rise time of the electrical overload are also longer, usually in the order of milliseconds. In short, the electrical overload is a slower but long-lasting event, during which the integrated circuit is usually required to withstand greater energy and heat.

In an integrated circuit, ESD protection and EOS protection are usually achieved separately. A clamp circuit for EOS protection is often composed of an EOS detecting circuit and big N-Metal-Oxide-Semiconductor (NMOS) devices. When an overstress voltage is detected in a power supply voltage of the integrated circuit by a detecting circuit, the gate voltage of a NMOS bigFET is increased, then the NMOS transistor is turned on and its output impedance is continuously reduced, thereby sinking an overload current, so that voltage difference between the power supply and ground of the integrated circuit is clamped within a safe range, and the integrated circuit is protected against damages.

ESD and EOS events can generate heat, especially in an EOS event, which generates a large amount of heat. To ensure that the integrated circuit is not damaged due to rapid temperature rise by enormous heats the NMOS bigFETs are usually required to have a large width in order to reduce the current density to ensure a low temperature rise. Thus a large amount of area in the integrated circuit will be occupied by NMOS bigFETs for ESD protection and NMOS bigFETs for EOS protections. Meanwhile the bigFETs serving as switching devices are prone to cause a large leakage current, especially in a high temperature working environment, thereby also reducing the standby time of mobile devices.

Therefore, how to provide a power clamp circuit, a chip and a dual-clamp method to solve the shortcomings of the prior art that ESD protection and EOS protection cannot be achieved at the same time while optimizing the performance of the circuit, has become an urgent technical problem facing those skilled in the art.

SUMMARY

The present disclosure provides a power clamp circuit, a chip and a dual-clamp method.

The present disclosure provides a power clamp circuit, applied to a circuit system to monitor the power supply voltage of the circuit system, and utilize one discharge path to perform both overload protection and ESD protection for the circuit system. The power clamp circuit includes: an EOS protection module, for outputting an EOS protection triggering signal when it is determined that the circuit system is electrically overstressed based on the power supply voltage; an ESD protection module, for outputting an ESD protection triggering signal when it is determined that an electrostatic event is present in the circuit system based on the power supply voltage; a switch control module connected to the EOS protection module and the ESD protection module, respectively, for turning on the discharge path based on the EOS protection signal to discharge an overload current, and turning on the discharge path based on the ESD protection signal to discharge an electrostatic current.

In an embodiment of the present disclosure, the Switch control module includes a switching device; the switching device is connected to the EOS protection module and the ESD protection module, respectively, and is used for turning on the discharge path for the overload current based on the EOS protection signal, and turning on the discharge path for the electrostatic current based on the ESD protection signal.

In an embodiment of the present disclosure, the EOS protection module includes an EOS detection unit and an EOS controlling unit; the EOS detection unit is connected to the EOS controlling unit, for providing a detected EOS signal to the EOS controlling unit; the EOS controlling unit generates the EOS protection signal based on the EOS signal, and the switching device is controlled by the EOS protection signal to turn on the discharge path for the EOS current.

In an embodiment of the present disclosure, the EOS detection unit includes: a first detection sub-unit and a second detection sub-unit; the first detection sub-unit is connected to the second detection sub-unit, for providing a detected EOS signal to the second detection sub-unit; the second detection sub-unit amplifies the detected EOS signal.

In an embodiment of the present disclosure, the first detection sub-unit includes: a first PMOS transistor, a second PMOS transistor, a first resistor, and a first capacitor; a source of the first PMOS transistor is connected to a power supply, and a drain and a gate of the first PMOS transistor are shorted and connected to a source of the second PMOS transistor; a drain and a gate of the second PMOS transistor are shorted and are connected to one end of the first resistor, and the other end of the first resistor is connected to ground; when the power supply voltage exceeds the sum of a threshold voltage of the first PMOS transistor and a threshold voltage of the second PMOS transistor, the first PMOS transistor and the second PMOS transistor are turned on, a current flowing through the first resistor gradually increases until a voltage across the first resistor turns on the second detection sub-unit; the first capacitor is used for low-pass filtering of the voltage across the first resistor.

In an embodiment of the present disclosure, the second detection sub-unit includes a second resistor and a first NMOS transistor; one end of the second resistor is connected to the power supply, the other end of the second resistor is connected to a drain of the first NMOS transistor, a source of the first NMOS transistor is connected to the ground, and a gate of the first NMOS transistor is turned on or off based on the voltage across the first resistor so that an output voltage of the second detection sub-unit is reduced.

In an embodiment of the present disclosure, the EOS controlling unit includes: a third resistor, a fourth resistor, and a third PMOS transistor; one end of the third resistor is connected to the power supply, and the other end of the third resistor is connected to a source of the third PMOS transistor; a gate of the third PMOS transistor receives the output voltage of the second detection sub-unit, and a drain of the third PMOS transistor is connected with a turn-on control terminal of the switching device; when the output voltage of the second detection sub-unit is reduced to a threshold voltage of the third PMOS transistor, the third PMOS transistor is controlled to conduct current, and a drain voltage of the third PMOS transistor is set as the EOS protection signal; the EOS protection signal controls the switching device to turn on, forming a path between the power supply voltage and the ground, in order to discharge the EOS current; one end of the fourth resistor is connected to the ESD protection module, and the other end of the fourth resistor is connected to the ground, to form a current path with the third resistor and the third PMOS transistor when an EOS is generated, so that the drain voltage of the third PMOS transistor is raised and the EOS protection signal is generated.

In an embodiment of the present disclosure, the ESD protection module includes a time constant unit and a reverse output unit; the time constant unit is connected to the reverse output unit, for suppressing fluctuations of an input voltage of the reverse output unit dependent on the power supply voltage; an output end of the reverse output unit is connected to a turn-on control terminal of the switching device, so that the reverse output unit outputs the ESD protection signal; the ESD protection signal controls the switching device to turn on, forming a path between a power supply and the ground, to discharge the electrostatic current.

In an embodiment of the present disclosure, the time constant unit includes an ESD protection resistor and an ESD protection capacitor; the ESD protection resistor and the ESD protection capacitor constitute a low-pass filter; one end of the ESD protection resistor is connected to the power supply, the other end of the ESD protection resistor is connected to one end of the ESD protection capacitor, and the other end of the ESD protection capacitor is connected to ground; a connection point of the ESD protection resistor and the ESD protection capacitor serves as an output end of the time constant unit and is connected to the reverse output unit; the time constant unit of the low-pass filter is used to suppress fluctuations of the input voltage of the reverse output unit dependent on the power supply voltage.

In an embodiment of the present disclosure, the reverse output unit includes a fourth PMOS transistor and a second NMOS transistor; a source of the fourth PMOS transistor is connected to the power supply, a gate of the fourth PMOS transistor and the gate of the second NMOS transistor are connected, and are connected to the output end of the time constant unit, a drain of the fourth PMOS transistor and the drain of the second NMOS transistor are connected, and are connected to the turn-on control terminal of the switching device; when electricalstatic is generated in the circuit system, the variation of an output voltage of the time constant unit lags behind the variation of a source voltage of the fourth PMOS transistor, so that the fourth PMOS transistor is turned on, and the power supply voltage at the source of the fourth PMOS transistor is input to the turn-on control terminal of the switching device as the ESD protection signal.

In an embodiment of the present disclosure, the switching device is a discharge MOS transistor, the discharge MOS transistor is turned on when the circuit system is electrically overstressed, to discharge the EOS current, and the discharge MOS transistor is turned on when there is electricalstatic in the circuit system, to discharge the electrostatic current.

The present disclosure further provides a chip including the power clamp circuit.

In an embodiment of the present disclosure, the chip is a drive output chip including a drive output circuit, and the drive output circuit is provided with the power clamp circuit.

The present disclosure provides a dual-clamp method, which is applied to the power clamp circuit; the power clamp circuit is applied to a circuit system, and utilizes one discharge path to perform both EOS protection and ESD protection for the circuit system; the dual-clamp method includes: monitoring a power supply voltage of the circuit system; outputting an EOS protection signal when it is determined based on the power supply voltage that the circuit system is electrically overstressed; turning on the discharge path according to the EOS protection signal, and discharging an EOS current; outputting an ESD protection signal when it is determined based on the power supply voltage that an electrostatic event is present in the circuit system; and turning on the discharge path according to the ESD protection signal, and discharging an electrostatic current.

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure. It should be noted that the following embodiments and features in the embodiments can be combined with each other if no conflict will result.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated.

The present disclosure utilizes one switch control component to provide one discharge path to realize both EOS protection and ESD protection, which also saves chip area and reduces leakage current of the circuit system, thereby increasing standby time of the circuit system.

The principle and embodiments of a power clamp circuit, chip, and dual-clamp method of the present disclosure will be described in detail below with reference to FIGS. 1 to 4, so that those skilled in the art can understand the power clamp circuit, chip, and dual-clamp method without creative work.

Figure 1:
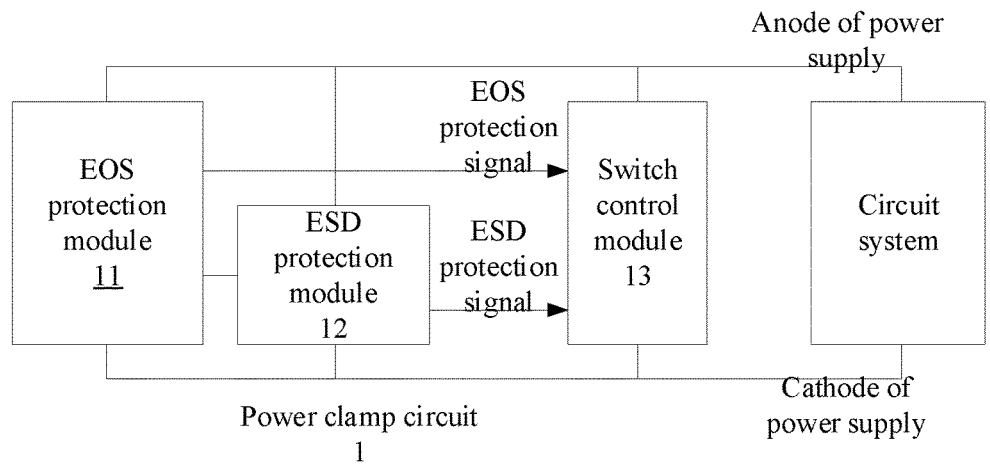
FIG. 1 is a block diagram showing a structure of a power clamp circuit according to one embodiment of the present disclosure.

Please refer to FIG. 1, which is a block diagram showing the structure of a power clamp circuit according to one embodiment of the present disclosure. As shown in FIG. 1, the power clamp circuit is applied to a circuit system, to monitor a power supply voltage of the circuit system and utilize one discharge path to perform both EOS protection and ESD protection for the circuit system. The circuit system refers to an integrated circuit that can complete a circuit function.

The power clamp circuit may include: an EOS protection module 11, an ESD module 12, and a switch control module 13.

The EOS protection module 11 determines whether the circuit system is electrically overstressed based on the power supply voltage, and if so, outputs an overload protection signal.

The ESD protection module 12 determines whether an electrostatic event is present in the circuit system based on the power supply voltage, and if so, outputs an ESD protection signal.

The switch control module 13 is connected to the EOS protection module and the ESD protection module, respectively, for turning on the discharge path based on the EOS protection signal to discharge an overload current, and turning on the discharge path based on the ESD protection signal to discharge an electrostatic current.

Figure 2:
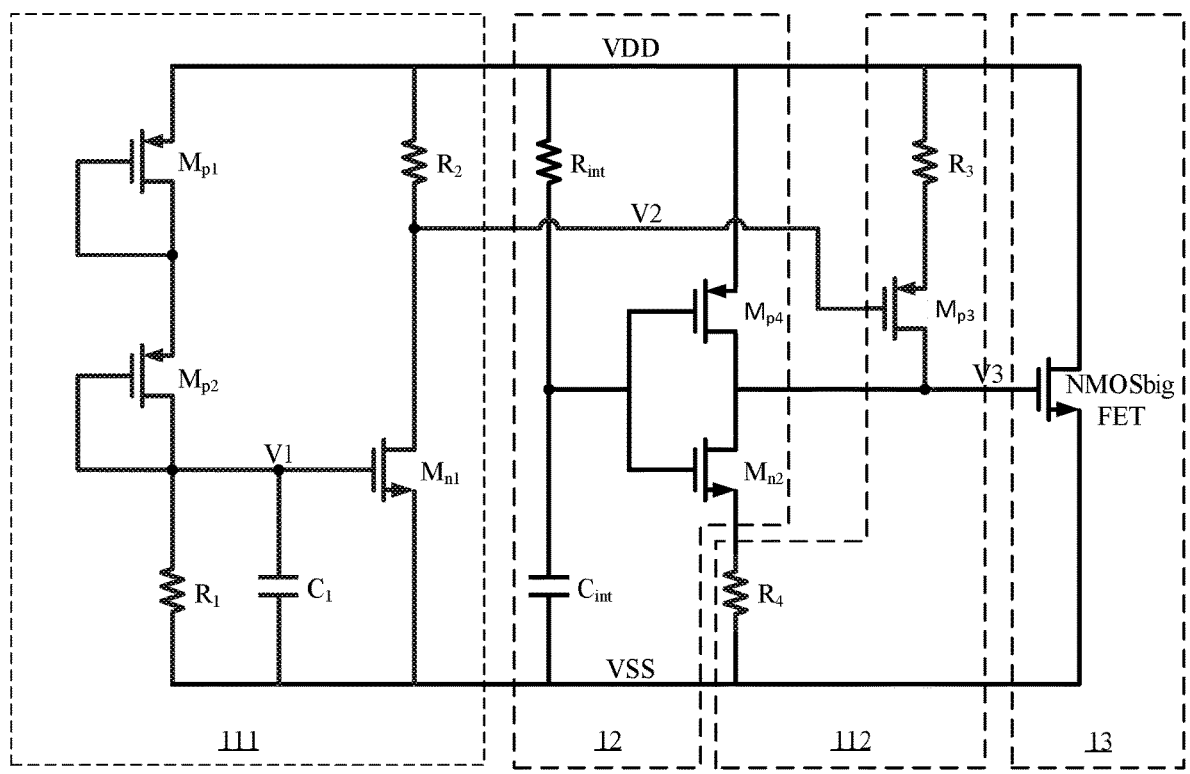
FIG. 2 shows a schematic diagram of a power clamp circuit according to one embodiment of the present disclosure.

Please refer to FIG. 2, which shows a circuit structure of a power clamp circuit according to one embodiment of the present disclosure. FIG. 2 shows a specific circuit structure of a power clamp circuit in one embodiment.

In an embodiment, the Switch control module 13 includes a switching device; the switching device is connected to the EOS protection module 11 and the ESD protection module 12 respectively, for turning on the discharge path for the overload current based on the EOS protection signal, and turning on the discharge path for the electrostatic current based on the ESD protection signal.

Specifically, the switching device is a discharge MOS transistor, which is turned on when the circuit system is electrically overstressed, to discharge the EOS current, and the discharge MOS transistor is turned on when there is static electricity in the circuit system, to discharge the electrostatic current. For example, the switching device is an NMOS bigFET as shown in FIG. 2.

In an embodiment, the EOS protection module 11 may include an EOS detection unit 111 and an EOS controlling unit 112.

The EOS detection unit 111 is connected to the EOS controlling unit 112 for providing a detected EOS signal to the EOS controlling unit 112.

Specifically, the EOS detection unit may include: a first detection sub-unit and a second detection sub-unit.

The first detection sub-unit is connected to the second detection sub-unit connection to provide a detected EOS signal to the second detection sub-unit.

In an embodiment, the first detection sub-unit may include: a first PMOS transistor $MP_{P1}$, a second PMOS transistor $M_{P2}$, a first resistor $R_1$, and a first capacitor $C_1$.

A source of the first PMOS transistor $M_{P1}$ is connected to a power supply VDD, and a drain and a gate of the first PMOS transistor $M_{P1}$ are shorted and connected to a source of the second PMOS transistor $M_{P2}$; a drain and a gate of the second PMOS transistor $M_{P2}$ are shorted and connected to one end of the first resistor $R_1$, and the other end of the first resistor $R_1$ is connected to ground.

When the power supply voltage VDD exceeds the sum of a threshold voltage of the first PMOS transistor $M_{P1}$ and a threshold voltage of the second PMOS transistor $M_{P2}$, the first PMOS transistor $M_{P1}$ and the second PMOS transistor $M_{P2}$ are turned on, and current flowing through the first resistor $R_1$ gradually increases until the second detection sub-unit is turned on.

The first capacitor $C_1$ is used for low-pass filtering of the voltage across the first resistor $R_1$, to filter out burrs generated by normal voltage of the circuit system during normal operation, in order to avoid false triggering. Since the time constant of EOS is usually large, and its rise time is in the order of millisecond, the detection of EOS will not be adversely affected.

The principle of the first detection sub-unit is as follows: an exemplary application environment for implementing the present disclosure may include a normal power supply voltage of 1.1 to 1.2V, and EOS protection is performed when the voltage at power supply voltage is increased to 2 Vat which and a PMOS cascading number of 2 (that is, the first PMOS transistor $M_{P1}$ and the second PMOS transistor $M_{P2}$ are cascaded). In other application examples, the size and cascading number of PMOS transistors can be adjusted according to the application requirements of the circuit system. Compared with resistors, the MOS diodes $M_{P1}$ and $M_{P2}$ have a turn-on voltage $V_{th}$ and an exponential current-voltage relationship, and the diodes are connected in series with the first resistor $R_1$, because of which, when the power supply voltage VDD is lower than the threshold voltages of $M_{P1}$ and $M_{P2}$, the current flowing through the first resistor $R1$ is 0, and an output voltage $V1$ of the first detection sub-unit is also 0V; when the power supply voltage VDD is increased to twice the threshold voltages of $M_{P1}$ and $M_{P2}$, $M_{P1}$ and $M_{P2P2}$ are turned on, and there is a small current flowing through the first resistor $R_1$; when the power supply voltage VDD continues to rise and the voltage across $R_1$ exceeds the threshold voltage of the $M_{n1}$, the second detection sub-unit is turned on.

The threshold voltages of $M_{P1}$ and $M_{P2}$ change with temperature, and usually the threshold voltages are lower when the temperature is high with higher voltage. But the current conduction capability of $M_{P1}$ and $M_{P2P2}$ usually decreases when the temperature increases. Therefore, when designing $M_{P1}$ and $M_{P2}$, it is necessary to fine tune their size to compensate the effects of temperature as much as possible, so as toreduce the variation range of the turn-on voltage. As long as there is enough guard band between a normal operating voltage and an EOS turn-on voltage, the voltage variations are acceptable, and a small leakage current and a considerably accurate turn-on voltage within a reasonable range can be achieved.

The second detection sub-unit is used for amplifying the EOS signal.

Further, the second detection sub-unit may include: a second resistor $R_2$ and a first NMOS transistor $M_{n1}$.

One end of the second resistor $R_2$ is connected to the power supply voltage VDD, the other end of the second resistor R2 is connected to the drain of the first NMOS transistor $M_{n1n1}$, the source of the first NMOS transistor $M_{n1n1}$ is connected to the ground VSS, and a gate of the first NMOS transistor $M_{n1n1}$ is turned on based on the voltage across the first resistor $R_1$ so that an output voltage V2 of the second detection sub-unit is reduced.

The principle of the second detection sub-unit is as follows: $M_{n1n1}$ and $R_2$ constitute a common source amplifier circuit for amplifying detected EOS signals; when the output voltage V1 of the first detection sub-unit is constantly rising and finally exceeding the turn-on voltage of $M_{n1n1}$, the $M_{n1n1}$ is turned on and starts to sink current, and the output voltage V2 of the second detection sub-unit begins to decrease from VDD, wherein the rate of decreasing is determined by the gain of the common source amplifier.

The EOS controlling unit 112 is used for generating an EOS protection signal based on an EOS signal, and the switching device is controlled by the EOS protection signal to turn on the discharge path for the EOS current.

Specifically, the EOS controlling unit may include: a third resistor $R_3$, a fourth resistor $R_4$, and a third PMOS transistor $M_{P3}$.

One end of the third resistor $R_3$ is connected to the power supply VDD, and the other end of the third resistor $R_3$ is connected to the source of the third PMOS transistor $M_{P3}$; the gate of the third PMOS transistor $M_{P3}$ receives the output voltage V2 of the second detection sub-unit, and the source of the third PMOS transistor $M_{P3}$ is connected with a turn-on control terminal of the NMOS bigFET. The third resistor $R_3$ reduces the gain of conversion from gate voltage to drain current of $M_{P3}$, which makes its current fluctuation smoother for the purpose of current limiting.

When the output voltage V2 of the second detection sub-unit is reduced to a threshold voltage of the third PMOS transistor $M_{P3}$, the third PMOS transistor $M_{P3}$ is controlled to turn on, and a drain voltage V3 of the third PMOS transistor $M_{P3}$ is used as an EOS protection signal; the EOS protection signal controls the switching device to turn on, forming a path between the power supply voltage and the ground, so as to discharge the EOS current.

One end of the fourth resistor R4 is connected to the ESD protection module 12, and the other end of the fourth resistor R4 is connected to the ground VSS, to form a current path with the third resistor R3 and the third PMOS transistor $M_{P3}$ when an electrical overstress event occurs, so that the drain voltage of the third PMOS transistor $M_{P3}$ is raised and the EOS protection signal is generated. The fourth resistor $R_4$ reduces the gain of conversion from gate voltage to drain current of the NMOS transistor $M_{n2}$, and acts as a current limiter.

The principle of the EOS controlling unit is as follows: the gate of the $M_{P3}$ receives the output voltage V2; as the power supply voltage VDD is raised above the EOS turn-on voltage, the voltage V2 gradually decreases, and when the voltage V2 is lowered to the threshold voltage of $M_{P3}$, $M_{P3}$ starts to turn on current. The rise time of the power supply voltage is longer (in the order of millisecond) when EOS occurs, and much longer than time constant $R_{int}*C_{int}$ for ESD protection, so the voltage across a capacitor $C_{int}$ can track the change of power supply voltage VDD. When the power supply VDD voltage is relatively high, the $M_{n2}$ also is turned on; at this time, the $M_{P3}$ remains off. A path from R3, $M_{P3}$, $M_{n2}$, to R4 is formed between the power supply VDD and the ground VSS. Since the second detection sub-unit acts as an amplifier stage, with the increase of the power supply voltage VDD, the increase in the drain current of $M_{P3}$ is greater than the increase in the drain current of $M_{n2}$, and the gate voltage V3 of the NMOS bigFET continues to increase. When the voltage V3 exceeds the threshold voltage of the NMOS bigFET, the NMOS bigFET forms a low-resistance current path between the power supply VDD and the ground VSS to discharge EOS current, thereby keeping the power supply voltage in a safe range and protecting internal devices of the integrated circuit.

In an embodiment, the ESD protection module 12 includes a time constant unit and a reverse output unit. The time constant unit is connected to the reverse output unit, for restraining an input end voltage of the reverse output unit from changing with the power supply voltage.

Specifically, the time constant unit may include an ESD protection resistor $R_{int}$ and an ESD protection capacitor Cint; the ESD protection resistor $R_{int}$ and the ESD protection capacitor $C_{int}$ constitute a low-pass filter.

One end of the ESD protection resistor $R_{int}$ is connected to the power supply VDD, the other end of the ESD protection resistor $R_{int}$ is connected to one end of the ESD protection capacitor $C_{int}$, and the other end of the ESD protection capacitor $C_{int}$ is connected to the ground VSS.

A connection point of the ESD protection resistor $R_{int}$ and the ESD protection capacitor $C_{int}$ acts as an output end of the time constant unit, and is connected to the reverse output unit; the time constant of the low-pass filter is used to restrain an input end voltage of the reverse output unit from changing with the power supply voltage.

An output end of the reverse output unit is connected to the turn-on control terminal of the NMOS bigFET switching device, so that the reverse output unit outputs an ESD protection signal; the ESD protection signal controls the switching device to turn on, forming a path between the power supply voltage and the ground, to discharge the electrostatic current.

Specifically, the reverse output unit may include a fourth PMOS transistor $M_{P3}$ and a second NMOS transistor $M_{n2}$.

The source of the fourth PMOS transistor $M_{P4}$ is connected to the power supply, the gate of the fourth PMOS transistor $M_{P4}$ and the gate of the second NMOS transistor $M_{n2}$ are connected, and are connected to the output end of the time constant unit.

The drain of the fourth PMOS transistor $M_{P4}$ and the drain of the second NMOS transistor $M_{n2}$ are connected, and are connected to the turn-on control terminal of the NMOS bigFET switching device.

When an electrostatic event is present in the circuit system, the variation of an output voltage of the time constant unit lags behind the variation of a source voltage of the fourth PMOS transistor $M_{P4}$, so that the fourth PMOS transistor $M_{P4}$ is turned on, and the power supply voltage VDD connected to the source of the fourth PMOS transistor $M_{P3}$ is input to the turn-on control terminal of the NMOS bigFET switching device as the ESD protection signal.

The principle of the ESD protection module is described below: during an ESD event, since the time constant of ESD is far smaller than the time constant of an EOS discharge, the C1 in the first detection sub-unit can ensure the voltage V1 is lower than the threshold voltage of $M_{n1n1}$, so the voltage V2 remains at the power supply voltage VDD such that $M_{P3}$ is always in an off state. The detection process of ESD protection is completed by the resistor $R_{int}$, the capacitor $C_{int}$, and a reverse output unit (made up of $M_{P3}$ and $M_{n2}$), and R4 does not change the nature of the reverse output unit.

Therefore, the EOS protection module does not affect the functionality and effect of electrostatic detection and protection. The values of $R_{int}$ and $C_{int}$ should help to obtain a large time constant. For example, the time constant is in the order of a few hundred nanosecond, greater than voltage rise time of an electrostatic event, and less than power-up ramping time for a normal operation. When the power supply voltage VDD is rapidly rising, since the low-pass filter $R_{int} C_{int}$ has a large time constant, the input end of the reverse output unit, that is, the gate of the $M_{P3}$, cannot track the change of the power supply voltage VDD, and since the power supply of the reverse output unit, i.e., the source of the $M_{P4}$, is connected to power supply voltage VDD, the gate voltage of $M_{P4}$ is smaller than its source voltage, the $M_{P4}$ is turned on and then the output of the reverse output unit will switch from low to high, i.e., VDD, so that the NMOS transistor bigFET is turned on and its output impedance is rapidly reduced. Thus, an electrostatic current is discharged, so that the voltage difference between the power supply of the circuit system and the ground is clamped within a safe range, and the circuit system is protected against damages.

During a normal power-up ramping process of the circuit system:

On the one hand, since the rise time of the power supply voltage VDD is much greater than the time constant of the low-pass filter $R_{int}C_{int}$, the input voltage of the reverse output unit is fully capable of tracking the increase of the power supply voltage, so the output voltage of the reverse output unit is maintained at a low level and the NMOS bigFET is in an off state, which will not affect the normal operation of the circuit system.

On the other hand, since the normal operating voltage of the power supply VDD is lower than the turn-on voltage of EOS protection, the EOS signal will not be detected by the EOS detecting circuit. The voltage V1 remains at 0 V, and the voltage V2 remains at the power supply voltage VDD, which will not affect the normal power-up ramping process and operation of the circuit system.

Figure 3:
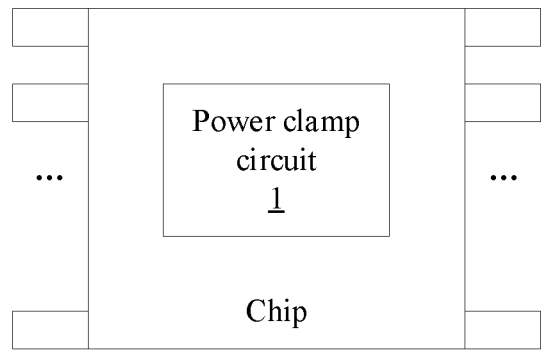
FIG. 3 shows a schematic diagram of a chip according to one embodiment of the present disclosure.

Please refer to FIG. 3, which shows a schematic diagram of a structure of a chip according to an embodiment of the present disclosure. The chip includes: the power clamp circuit according to above embodiments of the present disclosure.

The power clamp circuit includes: an EOS protection module, for outputting an EOS protection triggering signal when it is determined that the circuit system is electrically overstressed based on the power supply voltage; an ESD protection module, for outputting an ESD protection triggering signal when it is determined that an electrostatic event is present in the circuit system based on the power supply voltage; an switch control module connected to the EOS protection module and the ESD protection module, respectively, for turning on a discharge path based on the EOS protection signal to discharge an EOS current, and turning on the discharge path based on the ESD protection signal to discharge an electrostatic current.

In an embodiment of the present disclosure, the chip is a drive output chip including a drive output circuit, and the drive output circuit is provided with the above power clamp circuit. For example, the drive output circuit may be a stub series terminated driver (SST) circuit, which can provide EOS protection and ESD protection for the SST driver through the power clamp circuit. It should be noted that the drive output chip is only one embodiment of the chip described in the present disclosure; other types of chips that require ESD protection and EOS protection are included in the scope of the present disclosure.

Figure 4:
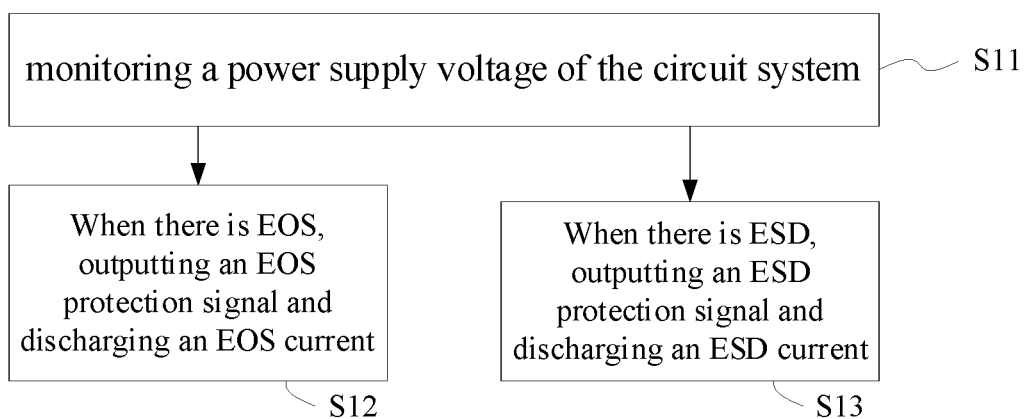
FIG. 4 shows a flowchart illustrating various steps of a dual-clamp method according to one embodiment of the present disclosure.

Please refer to FIG. 4, which shows a flowchart illustrating various steps of a dual-clamp method according to one embodiment of the present disclosure. As shown in FIG. 4, the dual-clamp method is applied to the power clamp circuit of the present disclosure, and the power clamp circuit utilizes one discharge path to perform both EOS protection and ESD protection for the circuit system, and the method includes:

S11, monitoring the power supply voltage of the circuit system;

S12, when it is determined that the circuit system is electrically overstressed based on the power supply voltage, outputting an EOS protection signal; turning on the discharge path according to the EOS protection signal to discharge an EOS current; and S13, when it is determined that an electrostatic event is present in the circuit system based on the power supply voltage, outputting an ESD protection signal; turning on the discharge path according to the ESD protection triggering signal to discharge an electrostatic current.

The scope of protection of the dual-clamp method described in the present disclosure is not limited to execution order of the steps listed in the present disclosure, and all the steps implemented in the prior art based on the principles of the present disclosure and implemented by replacing, adding, removing steps are included in the scope of the present disclosure.

The principle of the dual-clamp method described in the present disclosure corresponds to the power clamp circuit. The power clamp circuit described in the present disclosure can implement the dual-clamp method described in the present disclosure. The implementation device of the dual-clamp method includes, but is not limited to, the structure of the power clamp circuit listed in embodiments. Any structural modifications and replacements of the prior art based on the principle of the present disclosure are included in the protection scope of the present disclosure.

In summary, the power clamp circuit, chip and dual-clamp method as described by the present disclosure, combines an ESD protection clamp and an EOS protection clamp into one, which is equipped with corresponding detection and control circuits and realizes the dual protection against ESD and EOS by switching control of one transistor, without the ESD protection and EOS protection interfering with each other. The present disclosure utilizes one switch control component to share one discharge path for discharging both an EOS current and an electrostatic current, which saves on the chip area considerably, and reduces the leakage current of the circuit system, thereby further increasing the overall standby time of circuit system. Therefore, the present disclosure has a high industrial value.

The above-mentioned embodiments only exemplarily illustrate the principles and effects of the present disclosure, but are not used to limit the present disclosure. Anyone familiar with this technology can modify or change the above-mentioned embodiments without departing from the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A power clamp circuit, applied to a circuit system, wherein the power clamp circuit monitors a power supply voltage of the circuit system, and utilizes one discharge path to perform both EOS protection and ESD protection for the circuit system, wherein the power clamp circuit comprises:
- an EOS protection module, for outputting an EOS protection triggering signal when it is determined that the circuit system is electrically overstressed based on the power supply voltage;
- an ESD protection module, for outputting an ESD protection triggering signal when it is determined that an electrostatic event is present in the circuit system based on the power supply voltage; and
- a switch control module, connected to the EOS protection module and the ESD protection module, for turning on the discharge path based on the EOS protection signal to discharge an EOS current, or turning on the discharge path based on the ESD protection signal to discharge an electrostatic current,
- wherein the EOS protection module comprises an EOS detection unit and an EOS controlling unit, wherein the EOS detection unit is connected to the EOS controlling unit, for providing a detected EOS signal to the EOS controlling unit;
- wherein the EOS detection unit comprises: a first detection sub-unit and a second detection sub-unit, wherein the first detection sub-unit is connected to the second detection sub-unit, for providing a detected EOS signal to the second detection sub-unit, wherein the second detection sub-unit is used for amplifying the detected EOS signal;
- wherein the first detection sub-unit comprises: a first PMOS transistor, a second PMOS transistor, a first resistor, and a first capacitor, wherein a source of the first PMOS transistor is connected to a power supply, and a drain and a gate of the first PMOS transistor are shorted and connected to a source of the second PMOS transistor, wherein a drain and a gate of the second PMOS transistor are shorted and are connected to one end of the first resistor, wherein the other end of the first resistor is connected to ground, wherein when the power supply voltage exceeds the sum of a threshold voltage of the first PMOS transistor and a threshold voltage of the second PMOS transistor, the first PMOS transistor and the second PMOS transistor are turned on, a current flowing through the first resistor gradually increases until a voltage across the first resistor turns on the second detection sub-unit, wherein the first capacitor is used for low-pass filtering of the voltage across the first resistor.

2. The power clamp circuit according to claim 1, wherein the switch control module comprises a switching device, and the switching device is connected to the EOS protection module and the ESD protection module respectively, for turning on the discharge path for the EOS current based on the EOS protection signal, or turning on the discharge path for the electrostatic current based on the ESD protection signal.

3. The power clamp circuit according to claim 2, wherein the EOS controlling unit generates the EOS protection signal based on the EOS signal, and the switching device is controlled by the EOS protection signal to turn on the discharge path for the EOS current.

4. The power clamp circuit according to claim 1, wherein the second detection sub-unit comprises a second resistor and a first NMOS transistor,
wherein one end of the second resistor is connected to the power supply, the other end of the second resistor is connected to a drain of the first NMOS transistor, a source of the first NMOS transistor is connected to the ground, and a gate of the first NMOS transistor is turned on or off based on the voltage across the first resistor so that an output voltage of the second detection sub-unit is reduced.

5. The power clamp circuit according to claim 4, wherein the EOS controlling unit comprises: a third resistor, a fourth resistor, and a third PMOS transistor,
wherein one end of the third resistor is connected to the power supply, and the other end of the third resistor is connected to a source of the third PMOS transistor, wherein a gate of the third PMOS transistor receives the output voltage of the second detection sub-unit, and a drain of the third PMOS transistor is connected with a turn-on control terminal of the switching device,
wherein when the output voltage of the second detection sub-unit is reduced to a threshold voltage of the third PMOS transistor, the third PMOS transistor is controlled to turn on, and a drain voltage of the third PMOS transistor is set as the EOS protection signal, wherein the EOS protection signal controls the switching device to turn on, forming a path between the power supply voltage and the ground, in order to discharge the EOS current,
wherein one end of the fourth resistor is connected to the ESD protection module, and the other end of the fourth resistor is connected to the ground, wherein the fourth resistor, the third resistor, and the third PMOS transistor form a current path when an EOS is generated, so that the drain voltage of the third PMOS transistor is raised to generate the EOS protection signal.

6. The power clamp circuit according to claim 1, wherein the ESD protection module comprises a time constant unit and a reverse output unit,
wherein the time constant unit is connected to the reverse output unit, for restraining an input end voltage of the reverse output unit from changing with the power supply voltage,
wherein an output end of the reverse output unit is connected to a turn-on control terminal of the switching device, so that the reverse output unit outputs the ESD protection signal, wherein the switching device is turned on by the ESD protection signal to form a path between a power supply voltage and the ground, so as to discharge the electrostatic current.

7. The power clamp circuit according to claim 6, wherein the time constant unit comprises an ESD protection resistor and an ESD protection capacitor, wherein the ESD protection resistor and the ESD protection capacitor constitute a low-pass filter,
wherein one end of the ESD protection resistor is connected to the power supply, the other end of the ESD protection resistor is connected to one end of the ESD protection capacitor, and the other end of the ESD protection capacitor is connected to the ground,
wherein a connection point of the ESD protection resistor and the ESD protection capacitor serves as an output end of the time constant unit and is connected to the reverse output unit; the time constant unit of the low-pass filter is used to restrain an input end voltage of the reverse output unit from changing with the power supply voltage.

8. The power clamp circuit according to claim 7, wherein the reverse output unit comprises a fourth PMOS transistor and a second NMOS transistor,
wherein a source of the fourth PMOS transistor is connected to the power supply, a gate of the fourth PMOS transistor and the gate of the second NMOS transistor are connected, and are connected to the output end of the time constant unit, a drain of the fourth PMOS transistor and the drain of the second NMOS transistor are connected, and are connected to the turn-on control terminal of the switching device, wherein when an electrostatic event is present in the circuit system, the variation of an output voltage of the time constant unit lags behind the variation of a source voltage of the fourth PMOS transistor, so that the fourth PMOS transistor is turned on, and the power supply voltage at the source of the fourth PMOS transistor is input to the turn-on control terminal of the switching device as the ESD protection signal.

9. The power clamp circuit according to claim 1, wherein the switching device is a discharge MOS transistor, the discharge MOS transistor is turned on when the circuit system is electrically overstressed, to discharge the EOS current, and the discharge MOS transistor is turned on when there is static electricity in the circuit system, to discharge the electrostatic current.

10. A chip, comprising:
the power clamp circuit according to claim 1.

11. The chip according to claim 10, wherein the chip is a drive output chip, the drive output chip comprising a drive output circuit, wherein the drive output circuit is provided with the power clamp circuit.

12. A dual-clamp method, applied to the power clamp circuit of claim 1, wherein the power clamp circuit is applied in a circuit system, and utilizes one discharge path to perform both EOS protection and ESD protection for the circuit system, wherein the dual-clamp method comprises:

monitoring the power supply voltage of the circuit system;

when it is determined that the circuit system is electrically overstressed based on the power supply voltage, outputting an EOS protection signal; turning on the discharge path according to the EOS protection signal, and discharging an EOS current; and when it is determined that an electrostatic event is present in the circuit system based on the power supply voltage, outputting an ESD protection signal; turning on the discharge path according to the ESD protection signal, and discharging an electrostatic current.

* * * * *